(12) United States Patent
Ueda et al.

(10) Patent No.: US 6,517,980 B2
(45) Date of Patent: Feb. 11, 2003

(54) PHOTOSENSITIVE RESIN COMPOSITION, COLOR FILTER, AND COPOLYMER RESIN USEFUL FOR THEM

(75) Inventors: Kenji Ueda, Shinjuku-Ku (JP); Shunsuke Sega, Shinjuku-Ku (JP)

(73) Assignee: Dai Nippon Printing Co., Ltd. (JP)

(*) Notice: Subject to any disclaimer, the term of this patent is extended or adjusted under 35 U.S.C. 154(b) by 0 days.

(21) Appl. No.: 10/114,466

(22) Filed: Apr. 3, 2002

(65) Prior Publication Data

US 2002/0172873 A1 Nov. 21, 2002

Related U.S. Application Data

(62) Division of application No. 09/512,347, filed on Feb. 24, 2000, now Pat. No. 6,410,206.

(30) Foreign Application Priority Data

Feb. 25, 1999 (JP) .............................. 11-49177
Feb. 25, 1999 (JP) .............................. 11-49178

(51) Int. Cl.[7] .............................. G03F 7/11; G03F 7/40; G03F 7/30
(52) U.S. Cl. .......................................... 430/14; 430/321
(58) Field of Search .................................... 430/14, 321

(56) References Cited

U.S. PATENT DOCUMENTS

| | | | |
|---|---|---|---|
| 4,025,348 A | 5/1977 | Tsukada et al. ............ | 96/115 R |
| 4,742,121 A | 5/1988 | Toman ........................ | 525/286 |
| 4,999,136 A | 3/1991 | Su et al. ...................... | 252/512 |
| 5,153,102 A | 10/1992 | Lee et al. ................. | 430/284.1 |
| 5,882,842 A | 3/1999 | Akaki et al. ............. | 430/280.1 |

FOREIGN PATENT DOCUMENTS

| | | |
|---|---|---|
| DE | 197 57 090 A1 | 4/1999 |
| EP | 0 539 606 A1 | 5/1993 |
| EP | 0 977 085 A1 | 2/2000 |
| WO | WO 95/00573 | 5/1995 |

*Primary Examiner*—Cynthia Hamilton
(74) *Attorney, Agent, or Firm*—Parkhurst & Wendel, L.L.P.

(57) ABSTRACT

A color filter including a transparent substrate, a colored layer on the substrate, and a protective layer on the colored layer. The protective layer is the product formed by exposing, developing, and heating a coating containing an epoxy-containing copolymer resin having 0 to 55% by mole of formula (1), 5 to 95% by mole of formula (2), and 5 to 95% by mole of formula (3), the formula (1) units having been partially reacted, through carboxyl groups, with a (meth)acryloylalkyl isocyanate compound, the formula (2) units having been partially reacted, through hydroxyl groups, with a (meth)acryloylalkyl isocyanate compound, the copolymer resin containing 5 to 95% by mole of (meth) acryloyl groups, an acid value of 0 to 400 mg KOH/g, and a weight average molecular weight of 5,000 to 1,000,000.

2 Claims, 1 Drawing Sheet

PHOTOSENSITIVE RESIN COMPOSITION, COLOR FILTER, AND COPOLYMER RESIN USEFUL FOR THEM

This is a Division of application Ser. No. 09/512,347 filed Feb. 24, 2000 now U.S. Pat. No. 6,410,206 B1.

BACKGROUND OF THE INVENTION

1. Field of the Invention

The present invention relates to a photosensitive resin composition and a color filter provided with a protective layer formed of the photosensitive resin composition, and more particularly to a color filter which can realize color liquid-crystal displays having excellent display quality and high reliability. The present invention also relates to a novel epoxy-containing copolymer resin usable in the photosensitive resin composition.

2. Background Art

In recent years, color liquid-crystal displays have drawn attention as flat displays. They generally have a structure comprising; a color filter; a counter electrode substrate facing the color filter; and a liquid-crystal layer provided in a gap (1 to 10 μm) between the color filter and the counter electrode substrate. The structure of the color filter is such that a colored layer of a black matrix and a plurality of colors (generally three primary colors, red (R), green (G), and blue (B)) or, in recent years, a color hologram is provided on a transparent substrate and a protective layer and a transparent electrode are stacked thereon in that order. These color liquid-crystal displays are constructed so that a color image is obtained by controlling the light transmission of the liquid-crystal layer in its portions corresponding to pixels of respective colored layers R, G, and B or a color hologram.

In the color filter, the protective layer, when the color filter comprises the colored layer, functions to protect and flatten the color filter. In general, color liquid-crystal displays have a problem that the presence of uneven gap attributable to the waviness of the surface of the transparent substrate in the color filter, uneven gap among R, G, and B pixels, or uneven gap within pixels of R, G, and B lowers the flatness of the transparent electrode. This causes uneven colors and uneven contrast, leading to lowered image quality. In particular, in color liquid crystal displays of STN (super-twisted nematic) system, the flatness greatly affects the image quality. This renders flattening by the protective layer very important.

In use, the color filter is adhered to the counter electrode. The assembly is then tested for display quality. In consideration of reutilizability of the color filter when the assembly is judged to be unacceptable in the display quality test, the protective layer is preferably provided only in specific regions so as to cover the colored layers on the transparent substrate. To this end, the protective layer has been formed using a photocurable resin which permits portions to be cured to be easily limited through a mask.

In the formation of the protective layer using the conventional resin, an organic solvent is used in the development after exposure. This is troublesome in handleability and wastewater treatment and further lacks in profitability and stability. In order to solve this problem, a photocurable resin has been developed which, by virtue of the introduction of an acidic group into the photocurable resin, permits alkali development after the exposure.

In this type of photosensitive resin composition, after patterning by ultraviolet irradiation, development with an alkali is carried out, followed by heat treatment to prepare a color filter. In the development with an alkali, patterning is carried out through the action of carboxyl groups in the copolymer resin. After the development, water resistance and alkali resistance are required of the copolymer resin. Therefore, the carboxyl group remaining in the photocured pattern should be heat treated in the presence of an epoxy resin or the like to impart water resistance and pattern strength.

For this reason, the present inventors have proposed, in Japanese Patent Application No. 99240/1998, a copolymer resin which, as an alkali-developable photocurable copolymer resin, enables alkali-soluble groups, such as carboxylic acid groups, and radically polymerizable groups specifying curability, such as acryloyl group, to be regulated by taking into consideration curability, alkali solubility and the like. Further, in Japanese Patent Application No. 216868/1998, the present inventors have proposed a photosensitive resin composition comprising this alkali-developable photocurable copolymer resin and an epoxy resin, such as a cresol novolak type epoxy resin, and a color filter. However, the provision of a photosensitive resin composition possessing excellent curability, alkali resistance and other properties and a color filter, which can be produced by a simple process, has excellent flatness, and can realize highly reliable color liquid-crystal displays having excellent display quality, have been desired in the art.

SUMMARY OF THE INVENTION

Accordingly, it is an object of the present invention to provide a photosensitive resin composition possessing excellent hot pure water resistance, solvent resistance, heat resistance, alkali resistance, sensitivity, and pencil hardness and to provide a color filter which can be produced by a simple process, has excellent flatness, and exhibits excellent display quality and reliability.

It is another object of the present invention to provide a novel epoxy-containing copolymer resin usable in the photosensitive resin composition.

In order to attain the above objects of the present invention, according to one aspect of the present invention, there is provided an epoxy-containing copolymer resin comprising 0 to 55% by mole of constituent units represented by formula (1), 5 to 95% by mole of constituent units represented by formula (2), and 5 to 95% by mole of constituent units represented by formula (3), the constituent units represented by formula (1) having been partially reacted, through carboxyl groups thereof, with a (meth)acryloylalkyl isocyanate compound, the constituent units represented by formula (2) having been partially reacted, through hydroxyl groups thereof, with a (meth)acryloylalkyl isocyanate compound, said copolymer resin containing 5 to 95% by mole of (meth)acryloyl groups and having an acid value of 0 to 400 mg KOH/g and a weight average molecular weight of 5,000 to 1,000,000 as determined using polystyrene as a standard:

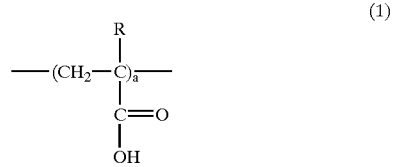

-continued

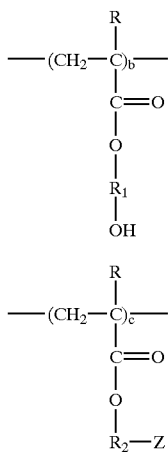

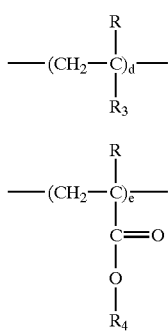

wherein R represents hydrogen or an alkyl group having 1 to 5 carbon atoms; $R_1$ represents an alkylene group having 2 to 4 carbon atoms; $R_2$ represents an alkylene group having 1 to 4 carbon atoms; Z represents a 1,2-epoxy, 1,3-epoxy, or 1,4-epoxy group; and a, b, and c are integers respectively corresponding to said molar percentages.

Preferably, the copolymer resin further comprises 0 to 75% by mole of constituent units represented by formula (4) and 0 to 75% by mole of constituent units represented by formula (5):

wherein R represents hydrogen or an alkyl group having 1 to 5 carbon atoms, $R_3$ represents an aromatic carbon ring, $R_4$ represents an alkyl or aralkyl group, and d and e are integers corresponding respectively to contents in terms of % by mole of the constituent units.

According to another aspect of the present invention, there is provided a photosensitive resin composition comprising: the above epoxy-containing copolymer resin; an alkali-developable photocurable copolymer resin; a bifunctional or higher polyfunctional photopolymerizable acrylate monomer; and an initiator, the alkali-developable photocurable copolymer resin comprising 5 to 55% by mole of constituent units represented by formula (1) and 5 to 95% by mole of constituent units represented by formula (2), the constituent units represented by formula (1) having been partially reacted, through carboxyl groups thereof, with a (meth)acryloylalkyl isocyanate compound, the constituent units represented by formula (2) having been partially reacted, through hydroxyl groups thereof, with a (meth) acryloylalkyl isocyanate compound, the copolymer resin containing 5 to 95% by mole of (meth)acryloyl groups and having an acid value of 5 to 400 mg KOH/g and a weight average molecular weight of 5,000 to 1,000,000 as determined using polystyrene as a standard.

In the photosensitive resin composition, preferably, the alkali-developable photocurable copolymer resin and the epoxy-containing copolymer resin each further comprise 0 to 75% by mole of constituent units represented by formula (4) and 0 to 75% by mole of constituent units represented by formula (5).

According to a further aspect of the present invention, there is provided a color filter comprising: a transparent substrate; a colored layer provided on the transparent substrate; and a protective layer provided so as to cover the colored layer, the protective layer having been formed by coating the above photosensitive resin composition, exposing the coating, developing the exposed coating with an alkali, and heating the developed coating.

As compared with conventional phenol novolak type epoxy resins and the like, the epoxy-containing copolymer resin according to the present invention has higher miscibility with an alkali-developable photocurable copolymer resin by virtue of the similarity of the structure, and, when used in a protective layer of a color filter, upon crosslinking at the time of heat curing, can form a pattern possessing excellent strength, alkali resistance, and water resistance.

The photosensitive resin composition of the present invention, by virtue of the use of an alkali-developable photocurable copolymer resin having controlled alkali solubility and curability and an epoxy-containing copolymer resin possessing excellent miscibility with the alkali-developable photocurable copolymer resin, possesses excellent hot pure water resistance, solvent resistance, heat resistance, alkali resistance, sensitivity, and pencil hardness. The use of this photosensitive resin composition in the formation of a protective layer can realize a color filter which can be produced by a simple process, has excellent flatness, and exhibits excellent display quality and reliability.

DESCRIPTION OF THE PREFERRED EMBODIMENTS

Figure 1:
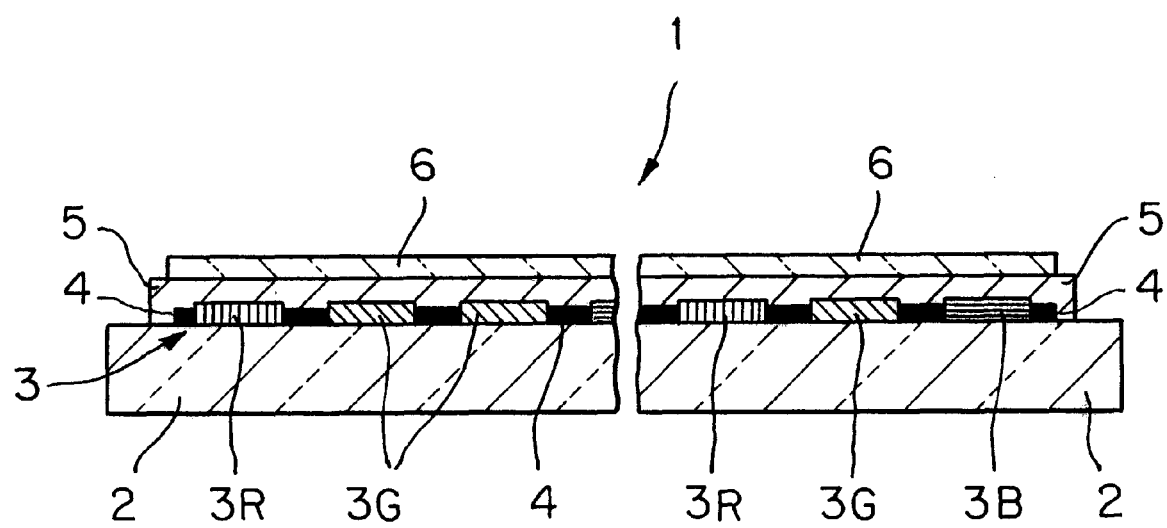
FIG. 1 is a schematic diagram showing the construction of one embodiment of the color filter according to the present invention.

The photosensitive resin composition of the present invention comprises an alkali-developable photocurable copolymer resin, an epoxy-containing copolymer resin, a bifunctional or higher polyfunctional photopolymerizable acrylate monomer, and an initiator. As described below, the alkali-developable photocurable copolymer resin and the epoxy-containing copolymer resin each basically contain constituent units comprising (meth)acryloyl groups introduced into constituent units represented by formula (1) and constituent units comprising (meth)acryloyl groups introduced into constituent units represented by formula (2). If necessary, these copolymer resins may further contain constituent units represented by formula (4) and constituent units represented by formula (5). As used herein, the term "(meth)acryloyl group" refers to a methacryloyl group or an acryloyl group, and the term "(meth)acrylic acid" refers to methacrylic acid or acrylic acid.

The epoxy-containing copolymer resin according to the present invention will be first described.

In formulae (1) to (5), R represents hydrogen or an alkyl group having 1 to 5 carbon atoms. Examples of alkyl groups usable herein include methyl, ethyl, n-propyl, isopropyl, n-butyl, isobutyl, sec-butyl, tert-butyl, and n-pentyl groups.

The constituent unit represented by formula (1) is an optional component in the epoxy-containing copolymer resin. The epoxy-containing copolymer resin containing the constituent units represented by formula (1), however, will be described by way of example. Monomers usable for introducing the constituent units represented by formula (1) include, for example, acrylic acid, methacrylic acid, 2-carboxy-1-butene, 2-carboxy-1-pentene, 2-carboxy-1-hexene, and 2-carboxy-1-heptene. According to the photosensitive resin composition using the epoxy-containing copolymer resin according to the present invention, the photocurability and the alkali solubility are imparted by the alkali-developable photocurable copolymer resin described below. The epoxy-containing copolymer resin also can improve the alkali solubility by adding the constituent units represented by formula (1) thereto. The content of the constituent units represented by formula (I) is preferably such that the stability of the epoxy-containing copolymer resin is not deteriorated, that is, 0 to 55% by mole, preferably 5 to 30% by mole.

The constituent units represented by formula (2) are basically those in which (meth)acryloyl groups are introduced. Examples of $R_1$ include ethylene, propylene, and butylene groups. Specific examples of monomers usable for introducing the constituent units represented by formula (2) include 2-hydroxyethyl acrylate, 2-hydroxyethyl methacrylate, 2-hydroxypropyl acrylate, 2-hydroxypropyl methacrylate, 4-hydroxybutyl acrylate, and 4-hydroxybutyl methacrylate. The constituent units represented by formula (2) have been partially reacted through hydroxyl groups thereof with the (meth)acryloylalkyl isocyanate compound to introduce (meth)acryloyl groups therein. The content of the constituent units represented by formula (2) is regulated according to the level of photopolymerizability required of the copolymer resin and is 5 to 95% by mole, preferably 10 to 50% by mole.

The constituent units represented by formula (3) are those for introducing epoxy groups into the copolymer resin. In formula (3), $R_2$ may represent an alkylene group having 1 to 4 carbon atoms, such as a methylene, ethylene, propylene, or butylene group; and Z may represent a 1,2-epoxy, 1,3-epoxy, or 1,4-epoxy group. The constituent units represented by formula (3) may have, as a substituent, a bulky ballast group, such as an aromatic ring, which can improve the mechanical properties of the coating. Monomers usable for the introduction of the epoxy group into the copolymer resin include: oxetane acrylates, such as glycidyl methacrylate, (3-methyl-3-oxetanyl)methyl acrylate, and (3-ethyl-3-oxetanyl)methyl acrylate; oxetane methacrylates, such as (3-methyl-3-oxetanyl)methyl methacrylate, and (3-ethyl-3-oxetanyl) methyl methacrylate; and 2-tetrahydropyranyl acrylate and 2-tetrahydropyranyl methacrylate. Since the constituent units represented by formula (3) do not react with the (meth)acryloylalkyl isocyanate compound used in the introduction of the (meth)acryloyl group into the constituent units represented by formulae (1) and (2), the epoxy group is left.

In the photosensitive resin composition containing the epoxy-containing copolymer resin according to the present invention, the content of the constituent units represented by formula (3) is regulated by the amount of the carboxyl group left in the pattern after the development with an alkali. The content is 5 to 95% by mole, preferably 10 to 50% by mole.

The epoxy-containing copolymer resin according to the present invention comprises the constituent units represented by formulae (1), (2), and (3). Other constituent units, which may be contained in the epoxy-containing copolymer resin, include constituent units represented by formulae (4) and (5).

The constituent units represented by formula (4) function to impart coatability to the copolymer resin. Examples of $R_3$ usable herein include aromatic rings, such as phenyl and naphthyl groups. Monomers usable for introducing the constituent units represented by formula (4) include, for example, styrene and α-methylstyrene. The aromatic ring may be substituted by a halogen atom, such as chlorine or bromine, an alkyl group, such as a methyl or ethyl group, an amino group, such as an amino or dialkylamino group, a cyano group, a carboxyl group, a sulfonic acid group, phosphoric acid group or the like. The content of the constituent units represented by formula (4) is 0 to 75% by mote, preferably 5 to 50% by mole.

The constituent units represented by formula (5) inhibit alkali development. Examples of $R_4$ usable herein include alkyl groups having 1 to 12 carbon atoms and aralkyl groups, such as benzyl and phenylethyl groups. Monomers usable for introducing the constituent units represented by formula (5) include, for example, (meth)acrylic esters, such as methyl (meth)acrylate, ethyl (meth)acrylate, butyl (meth) acrylate, 2-ethylhexyl (meth)acrylate, phenyl (meth) acrylate, cyclohexyl (meth) acrylate, dicyclopentanyl (meth) acrylate, dicyclopentanyloxyethyl (meth)acrylate, isobornyl (meth)acrylate, benzyl (meth)acrylate, and phenylethyl (meth)acrylate. The content of the constituent units represented by formula (5) is 0 to 75% by mole, preferably 5 to 50% by mole.

For the introduction of the constituent units represented by formulae (1) to (5), the monomers exemplified above respectively for these constituent units may be used alone or as a mixture of two or more.

Preferred polymerization solvents usable for the production of the copolymer resin comprising constituent units represented by formulae (1) to (5) include solvents free from active hydrogen, such as hydroxyl and amino groups. Examples thereof include: ethers, such as tetrahydrofuran; glycol ethers, such as diethylene glycol dimethyl ether, diethylene glycol diethyl ether, diethylene glycol methyl ethyl ether; cellosolve esters, such as methyl cellosolve acetate; propylene glycol monomethyl ether acetate; and 3-methoxybutyl acetate. Aromatic hydrocarbons, ketones, esters and the like are also usable.

Polymerization initiators commonly known as radical polymerization initiators may be used. Specific examples thereof include: azo compounds, such as 2,2'-azobisisobutylonitrile, 2,2'-azobis-(2,4-dimethylvaleronitrile), 2,2'-azobis-(4-methoxy-2,4-dimethylvaleronitrile); organic peroxides, such as benzoyl peroxide, lauroyl peroxide, tert-butyl peroxypivalate, and 1,1'-bis-(tert-butylperoxy)cyclohexane; and hydrogen peroxide. When a peroxide is used as the radical polymerization initiator, the peroxide may be used in combination with a reducing agent for use as a redox type polymerization initiator.

In the production of the copolymer resin comprising constituent units represented by formulae (1) to (5), molecular weight modifiers may be used to modify the weight average molecular weight. Examples of molecular weight modifiers usable herein include: halogenated hydrocarbons, such as chloroform and carbon tetrabromide; marcaptans, such as n-hexylmercaptan, n-octylmercaptan, n-dodecylmercaptan, tert-dodecylmercaptan, and thioglycolic acid; xanthogens, such as dimethylxanthogen disulfide and diisopropylxanthogen disulfide; terpinolene; and α-methylstyrene dimer.

The copolymer resin comprising constituent units represented by formulae (1) to (5) may be a random or block copolymer of monomers for the constituent units represented by formulae (1) to (5). The random copolymer may be produced by adding dropwise a composition comprising monomers and a catalyst to a polymerizer containing a solvent at a temperature of 80 to 110° C. over a period of 2 to 5 hr, followed by ripening.

The copolymer resin comprising the constituent units represented by formulae (1) to (5) has a weight average molecular weight, as determined using polystyrene as the standard (hereinafter referred to simply as "weight average molecular weight" or "Mw"), in the range of 5,000 to 1,000,000, an acid value of 0 to 400 mg KOH/g, and a hydroxyl value of 5 to 400 mg KOH/g.

The epoxy-containing copolymer resin according to the present invention is obtained by reacting the copolymer comprising constituent units represented by formulae (1) to (5) with a (meth)acryloyl-containing isocyanate compound.

The (meth)acryloylalkyl isocyanate compounds usable herein is one wherein a (meth)acryloyl group is bonded to an isocyanate group (—NCO) through an alkylene group. having 2 to 6 carbon atoms. Specific examples thereof include 2-acryloylethyl isocyanate and 2-methacryloylethyl isocyanate. 2-Methacryloylethyl isocyanate is commercially available from Showa Denko K. K. under the designation of "Karenz MOI" and the like.

The reaction of the copolymer comprising the constituent units represented by formulae (1) to (5) with the (meth)acryloylalkyl isocyanate compound may be carried out by adding dropwise the isocyanate compound to a solution of the copolymer in the presence of a minor amount of a catalyst. Catalysts usable herein include dibutyltin laurate. In the reaction, polymerization inhibitors, such as p-methoxyphenol, hydroquinone, naphthylamine, tert-butyl catechol, and 2,3-di-tert-butyl p-cresol, may be used according to need.

The (meth)acryloylalkyl isocyanate compound is bonded to hydroxyl groups of the constituent units represented by formula (2) through a urethane bond, and bonded to a part of carboxyl groups in the constituent units represented by formula (1) through an amido bond with the evolution of carbon dioxide gas. A product of a reaction between the copolymer comprising the constituent units represented by formulae (1) and (2) and the (meth)acryloylalkyl isocyanate compound is represented by formula (6). When the constituent units represented by formula (I) are unnecessary, the (meth)acryloylalkyl isocyanate compound is entirely bonded to the constituent units represented by formula (2). The constituent units represented by formula (3) are unreactive. Therefore, the description thereof will be omitted.

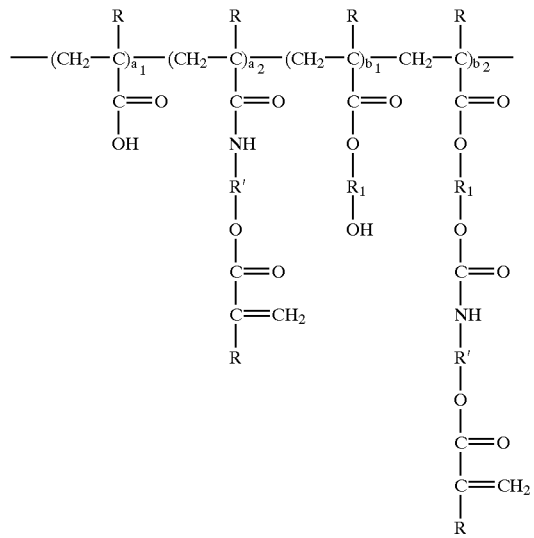

(6)

wherein R and $R_1$ each are as defined above in connection with formulae (1) to (4), R' represents an alkylene group having 2 to 6 carbon atoms, $a_1+a_2$ is a defined in formula (1), and $b_1+b_2$ is b defined in formula (2).

The rate of the reaction of the (meth)acryloylalkyl isocyanate compound with hydroxyl groups in the constituent units represented by formula (2) is about 20 times higher than that of the reaction of the (meth)acryloylalkyl isocyanate compound with carboxyl groups in the constituent units represented by formula (1). Therefore, the (meth) acryloyl group is mainly introduced into the constituent units represented by formula (2), and, in the constituent units represented by formula (1), most of the carboxyl groups remains unreacted even though the (meth)acryloyl group is introduced into a part of the carboxyl groups.

In connection with formula (6), regarding the portion derived from formula (2), the proportion of units with an index $b_1$ in the copolymer resin may be 0 to 10% by mole, and the proportion of units with an index b2 in the copolymer resin may be 5 to 95% by mole, provided that total of the proportion of units with an index $b_1$ and the proportion of units with an index $b_2$ is 5 to 95% by mole, while regarding the portion derived from formula (1), the proportion of units with an index $a_1$ in the copolymer resin may be 5 to 55% by mole, and the proportion of units with an index $a_2$ in the copolymer resin may be 0 to 10% by mole, provided that the total of the proportion of units with an index $a_1$ and the proportion of units with an index $a_2$ is 5 to 55% by mole. Thus, the amount of the (meth)acryloyl group introduced can be regulated.

The weight average molecular weight of the copolymer resin according to the present invention is generally 5,000 to 1,000,000, preferably 10,000 to 100,000, from the viewpoint of suitability for use in the formation of a protective layer for a color filter and, in addition, of alkali solubility and photocurability. When the weight average molecular weight is smaller than 5,000, the developability is excessively good. This makes it difficult to control pattern shapes at the time of pattern-wise exposure. Even though patterns could be formed, a problem occurs such as a reduction in final coating thickness. On the other hand, when the weight average molecular weight exceeds 1,000,000, the viscosity of the copolymer resin in the form of a resist is so high that the coatability is lowered. Further, in this case, the developability is deteriorated. This makes it difficult to form sharp patterns.

The amount of the (meth)acryloyl group introduced is generally 5 to 95% by mole, preferably 10 to 50% by mole. When the amount is less than 5% by mole, the photocurability is low and the effect of improving coating adhesion and resist properties is small.

The acid value of the epoxy-containing copolymer resin is 0 to 400 mg KOH/g. The acid value may be determined by taking into consideration the relationship between the acid value of the epoxy-containing copolymer resin and that of the alkali-developable photocurable copolymer resin described below. When the acid value is excessively high, the stability of the epoxy-containing copolymer resin is unfavorably lowered. In the epoxy-containing copolymer resin, the hydroxyl group in the constituent units represented by formula (2) is not always required to be left, and the hydroxyl value may be 0 to 200 mg KOH/g. However, the hydroxyl group may be left to effectively regulate the solubility of the copolymer resin in the solvent.

Upon heating after the exposure and the development, the epoxy-containing copolymer resin according to the present invention is reacted with the acidic group remaining unreacted. Thus, alkali resistance is imparted to the protective layer. As compared with the conventional phenol novolak epoxy resin or the like, the epoxy-containing copolymer resin has high miscibility with the alkali-developable photocurable copolymer resin by virtue of similarity of the structure, and, upon crosslinking at the time of heat curing, can be brought to a strong pattern. Further, the epoxy-containing copolymer resin can form a pattern possessing excellent alkali resistance and water resistance and thus can be brought to a photosensitive resin composition possessing excellent sensitivity. The content of the epoxy-containing copolymer resin in the resin composition is 5 to 60% by weight on solid basis. When the content of the epoxy-containing copolymer resin is less than 5% by weight, satisfactory alkali resistance cannot be imparted to the protective layer. On the other hand, when the content exceeds 60% by weight, the amount of the epoxy resin, which does not contribute to photocuring, is excessively increased. This unfavorably deteriorates the storage stability and developability of the resin composition.

Next, the alkali-developable photocurable copolymer resin according to the present invention will be described. In the alkali-developable photocurable copolymer resin, a copolymer resin described in Japanese Patent Application No. 99240/1998 is used. The alkali-developable photocurable copolymer resin comprises the same constituent units as the epoxy-containing copolymer resin, except that the constituent units represented by formula (3) is omitted from the constituent units represented by formulae (1) to (5). That is, the alkali-developable photocurable copolymer resin comprises 5 to 55% by mole of constituent units represented by formula (1) and 5 to 95% by mole of constituent units represented by formula (2), the constituent units represented by formula (1) having been partially reacted, through carboxyl groups thereof, with a (meth)acryloylalkyl isocyanate compound, the constituent units represented by formula (2) having been partially reacted, through hydroxyl groups thereof, with a (meth)acryloylalkyl isocyanate compound, said copolymer resin containing 5 to 95% by mole of (meth)acryloyl groups and having an acid value of 5 to 400 mg KOH/g and a weight average molecular weight of 5,000 to 1,000,000 as determined using polystyrene as a standard.

In the alkali-developable photocurable copolymer resin, the constituent units represented by formula (1) are indispensable and function to render the copolymer resin alkali-soluble. Monomers for the constituent units represented by formula (1) include those described above in connection with the epoxy-containing copolymer resin. The content of the constituent units represented by formula (1) is 5 to 55% by mole, preferably 10 to 25% by mole.

The constituent units represented by formula (2) are the same as those described above in connection with the epoxy-containing copolymer resin, and have been partially reacted through hydroxyl groups with a (meth)acryloylalkyl isocyanate compound to introduce (meth)acryloyl groups thereinto. The content of the constituent units represented by formula (2) is regulated according to the level of the photopolymerizability required of the copolymer resin, and is 5 to 95% by mole, preferably 10 to 50% by mole.

The alkali-developable photocurable copolymer resin comprises the constituent units represented by formulae (1) and (2). Other constituent units usable for the alkali-developable photocurable copolymer resin include constituent units represented by formulae (4) and (5) which are the same as those described above in connection with the epoxy-containing copolymer resin. The content of the constituent units represented by formula (4) is 0 to 75% by mole, preferably 5 to 50% by mole. The content of the constituent units represented by formula (5) is 0 to 75% by mole, preferably 5 to 50% by mole.

The alkali-developable photocurable copolymer resin may be produced in the same manner as described above in connection with the epoxy-containing copolymer resin, and the same catalyst, polymerization initiator, and molecular weight regulator as used in the production of the epoxy-containing copolymer resin may be used in the production of the alkali-developable photocurable copolymer resin.

The weight average molecular weight of the alkali-developable copolymer resin comprising the constituent units represented by formulae (1), (2), (4), and (5) as determined using polystyrene as a standard (hereinafter referred to simply as "weight average molecular weight" or "Mw") may be the same as that of the epoxy-containing copolymer resin. The copolymer resin has an acid value of 5 to 400 mg KOH/g and a hydroxyl value of 5 to 400 mg KOH/g.

The alkali-developable photocurable copolymer resin may be produced by reacting the copolymer resin comprising the constituent units represented by formulae (1), (2), (4), and (5) with a (meth)acryloyl-containing isocyanate compound.

The (meth)acryloylalkyl isocyanate compound may be the same as described above in connection with the epoxy-containing copolymer resin, and the (meth)acryloyl group may be introduced by the same reaction.

The weight average molecular weight of the alkali-developable photocurable copolymer resin is 5,000 to 1,000,000, preferably 10,000 to 100,000. When the weight average molecular weight is smaller than 5,000, the developability is excessively good. This makes it difficult to control pattern shapes at the time of pattern-wise exposure. Even though patterns could be formed, a problem occurs such as a reduction in final coating thickness. On the other hand, when the weight average molecular weight exceeds 1,000,000, the viscosity of the copolymer resin in the form of a resist is so high that the coatability is lowered. Further, in this case, the developability is deteriorated. This makes it difficult to form sharp patterns.

The amount of the (meth)acryloyl group introduced is 5 to 95% by mole, preferably 10 to 50% by mole. When the amount is less than 5% by mole, the photocurability is low and the effect of improving coating adhesion and resist properties is small.

The acid value of the alkali-developable, photocurable copolymer resin is 5 to 400 mg KOH/g, preferably 10 to 200 mg KOH/g. The acid value correlates with the alkali developability. Specifically, an acid value below the lower limit of the above range leads to problems such as poor developability and poor adhesion to the substrate and the color filter resin. On the other hand, an acid value above the upper limit of the above range provides excessively good developability, posing problems including the difficulty of regulating pattern shapes at the time of pattern-wise exposure. In the copolymer resin, the hydroxyl group in the constituent units represented by formula (2) is not always required to be left, and the hydroxyl value may be 0 to 200 mg KOH/g. However, the hydroxyl group may be left to effectively regulate the solubility of the copolymer resin in the solvent.

Alkali-developable photocurable copolymer resins suitable for the present invention will be exemplified. For all the copolymer resins exemplified below, the constituent units represented by formula (1) are derived from 2-hydroxyethyl methacrylate (HEMA) as the monomer, and the constituent units represented by formula (2) are derived from acrylic acid (AA) as the monomer. Further, the constituent units represented by formula (1) have been partially reacted, through carboxyl groups thereof, with 2-methacryloylethyl isocyanate (Karenz MOI, manufactured by Showa Denko K. K.), and the constituent units represented by formula (2) have been partially reacted, through hydroxyl groups thereof, with 2-methacryloylethyl isocyanate (Karenz MOI, manufactured by Showa Denko K. K.). The constituent units represented by formula (3) are derived from styrene (St) as the monomer, and the constituent units represented by formula (4) are derived from benzyl methacrylate (BZMA) as the monomer.

For the copolymer resins, the chemical composition (% by mole) is shown in Table 1, and the acryloyl group content (% by mole), the acid value (mg KOH/g), and the weight average molecular weight (Mw) as determined using polystyrene as the standard are shown in Table 2.

TABLE 1

| Copolymer resin No. | HEMA | AA | St | BzMA |
|---|---|---|---|---|
| (1) | 18 | 30 | 37 | 15 |
| (2) | 20 | 20 | 35 | 25 |
| (3) | 18 | 30 | 52 | 0 |
| (4) | 18 | 30 | 0 | 52 |

TABLE 2

| Copolymer resin No. | Mw | Content of acryloyl group | Acid value |
|---|---|---|---|
| (1) | 45,000 | 17.0 | 120 |
| (2) | 45,000 | 14.5 | 100 |
| (3) | 45,000 | 14.5 | 120 |
| (4) | 45,000 | 14.5 | 120 |

The content of the alkali-developable, photocurable copolymer resin in the photosensitive resin composition according to the present invention is in an amount of 5 to 80% by weight, preferably 10 to 50% by weight, on a solid basis. When the content of the copolymer resin is more than 80% by weight, the viscosity of the composition is excessively high, leading to lowered fluidity. This poses a problem of coatability. On the other hand, when the content of the copolymer is less than 5% by weight, the viscosity of the composition is excessively low, leading to unsatisfactory stability of a coating of the composition after coating and drying. This poses problems such as deteriorated suitability for exposure and development.

Bifunctional or higher polyfunctional polymerizable acrylate monomers usable herein include ethylene oxide (3 mol) adducts, ethylene oxide (6 mol) adducts, propylene oxide (3 mol) adducts, and propylene oxide (6 mol) adducts of dipentaerythritol hexaacrylate (DPHA), dipentaerythritol pentaacrylate (DPPA), pentaerythritol triacrylate (PETTA), trimethylolpropane triacrylate (TMPTA), and trimethylolpropane triacrylate (TMPTA). The content of the bifunctional or higher polyfunctional polymerizable acrylate monomer in the photosensitive resin composition is generally 3 to 50% by weight, preferably 5 to 20% by weight, on a solid basis. When the bifunctional or higher polyfunctional polymerizable acrylate monomer content is more than 50% by weight, the viscosity of the composition is excessively low, leading to unsatisfactory stability of a coating of the composition after coating and drying. This poses problems such as deteriorated suitability for exposure and development. On the other hand, a bifunctional or higher polyfunctional polymerizable acrylate monomer content of less than 3% by weight poses a problem that unexposed portions cannot be fully removed in the development.

Initiators usable herein include: radical polymerization initiators; and photo-induced acid generators which can generate acids upon exposure to light (particularly light with wavelengths of 190 to 410 nm). Radical polymerization initiators include 2-methyl-1-2-morpholinopropanone-1,2-benzyl-2-dimethylamino-1-(4-morpholinophenyl)-butanone-1,2,2'-bis(o-chlorophenyl)-4,5,4',5'-tetraphenyl-1,2'-biimidazole, 2,4-diethylthioxanthone, and 4,4-bisdiethylaminobenzophenone. The amount of the radical polymerization initiator used is generally 0.1 to 100 parts by weight, preferably 0.5 to 50 parts by weight, based on 100 parts by weight of the copolymer resin. When the amount of the radical polymerization initiator used is less than 0.1 part by weight, a photocuring reaction does not proceed. This results in lowered thickness of the final coating, heating resistance, chemical resistance or other properties. On the other hand, when the amount of the radical polymerization initiator used exceeds 100 parts by weight, the solubility thereof in the copolymer resin is saturated. This causes the precipitation of crystals of the initiator at the time of spin coating or leveling of the coating. This in turn makes it impossible to maintain the homogeneity of the coating in its surface and roughens the coating.

Photo-induced acid generators include the following compounds.

(1) Trichloromethyl-s-triazines: tris(2,4,6-trichloromethyl)-s-triazine, 2-phenyl-bis(4,6-trichloromethyl)-s-triazine, 2-(4-chlorophenyl)-bis(4,6-trichoromethyl)-s-triazine, 2-(3-chiorophenyl)-bis(4,6-tri-chloromethyl )-s-triazine, 2-(2-chlorophenyl)-bis-(4,6-trichloromethyl)-s-triazine, 2-(4-methoxyphenyl)-bis(4,6-trichloromethyl)-s-triazine, 2-(3-methoxy-phenyl)-bis(4,6-trichloromethyl)-s-triazine, 2-(2-methoxyphenyl)-bis (4,6-trichloromethyl)-s-triazine, 2-(4-methyithiophenyl)-bis(4,6-trichloromethyl)-s-triazine, 2-(3-methylthiophenyl)-bis(4,6-trichloromethyl)-s-triazine, 2-(2-methylthiophenyl)-bis (4,6-trichloro-methyl)-s-triazine, 2-(4-methoxynaphthyl)-bis(4,6-tri-chloromethyl)-s-triazine, 2-(3-methoxynaphthyl)-bis(4,6-trichloromethyl)-s- triazine, 2-(2-methoxynaphthyl)-bis-(4,6-trichloromethyl)-s-triazine, 2-(4-methoxy-β-styryl)-bis(4,6-trichloromethyl)-s-triazine, 2-(3-methoxy-β-styryl)-bis(4,6-trichloromethyl)-s-triazine, 2-(2-methoxy-β-styryl)-bis(4,6-trichloromethyl)-s-triazine, 2-(4-methylthio-β-styryl)-bis(4,6-trichloromethyl)-s-triazine, 2-(3-methylthio-β-styryl)-bis(4,6-trichloromethyl)-s-triazine, 2-(2-methylthio-β-styryl)-bis(4,6-trichloromethyl)-s-triazine and the like.

(2) Diaryliodonium salts: diphenyliodonium tetrafluoroborate, diphenyliodonium hexafluorophosphonate, diphenyliodonium hexafluoroarsenate, diphenyliodonium hexafluoromethanesulfonate, diphenyliodonium trifluoroacetate, diphenyliodonium p-toluenesulfonate, 4-methoxyphenylphenyliodonium tetrafluoroborate, 4-methoxyphenylphenyliodonium hexafluorophosphonate, 4-methoxyphenylphenyliodonium hexafluoroarsenate, 4-methoxyphenylphenyliodonium trifluoromethanesulfonate, 4-methoxyphenylphenyliodonium trifluoroacetate, 4-methoxyphenylphenyliodonium p-toluenesulfonate, bis(4-tert-butylphenyl)iodonium tetrafluoroborate, bis(4-tert-butylphenyl)iodonium hexafluorophosphonate, bis(4-tert-butylphenyl)iodonium hexafluoroarsenate, bis(4-tert-butylphenyl)iodonium hexafluoromethanesulfonate, bis(4-tert-butylphenyl)iodonium trifluoroacetate, bis(4-tert-butylphenyl)iodonium p-toluenesulfonate and the like.

(3) Triarylsulfonium salts: triphenylsulfonium tetrafluoroborate, triphenylsulfonium hexafluorophosphonate, triphenylsulfonium hexafluoroarsenate, triphenylsulfonium hexafluoromethanesulfonate, triphenylsulfonium trifluoroacetate, triphenylsulfonium p-toluenesulfonate, 4-methoxydiphenylsulfonium tetrafluoroborate, 4-methoxydiphenylsulfonium hexafluorophosphonate, 4-methoxydiphenylsulfonium hexafluoroarsenate, 4-methoxydiphenylsulfonium hexafluoromethanesulfonate, 4-methoxydiphenylsulfonium trifluoroacetate, 4-methoxydiphenylsulfonium p-toluenesulfonate, 4-phenylthiophenyldiphenyl tetrafluoroborate, 4-phenylthiophenyldiphenyl hexafluorophosphonate, 4-phenylthiophenyldiphenyl hexafluoroarsenate, 4-phenylthiophenyldiphenyl hexafluoromethanesulfonate, 4-phenylthiophenyldiphenyl trifluoroacetate, 4-phenylthiophenyldiphenyl p-toluensulfonate and the like.

Among these compounds, preferred trichloromethyl-s-triazines include 2-(3-chlorophenyl)-bis(4,6-trichloromethyl)-s-triazine, 2-(4-methoxyphenyl)-bis(4,6-trichloromethyl)-s-triazine, 2-(4-methylthiophenyl)-bis-(4,6-trichloromethyl)-s-triazine, 2-(4-methoxy-β-styryl)-bis(4,6-trichloromethyl)-s-triazine, and 2-(4-methoxynaphthyl)-bis(4,6-trichloromethyl)-s-triazine.

Preferred diaryliodonium salts include diphenyliodonium trifluoroacetate, 4-methoxyphenylphenyliodonium trifluoromethanesulfonate, 4-methoxyphenylphenyliodonium trifluorophosphonate, and 4-methoxyphenylphenyliodonium trifluoroacetate.

Preferred triarylsulfonium salts include triphenylsulfonium trifluoromethanesulfonate, triphenylsulfonium trifluoroacetate, 4-methoxydiphenylsulfonium tetrafluoromethanesulfonate, 4-methoxydiphenylsulfonium tetrafluoroacetate, and 4-phenylthiophenyldiphenyl-sulfonium trifluoroacetate.

The amount of the photo-induced acid generator added is generally 0.001 to 30 parts by weight, preferably 0.01 to 10 parts by weight, based on 100 parts by weight of the copolymer resin. When the amount of the photo-induced acid generator added is less than 0.001 part by weight, the amount of the acid generated upon the exposure of the photo-induced acid generator to light is too small to progress a photocuring reaction or crosslinking. This is likely to cause lowered thickness of the final coating, heating resistance, chemical resistance or other properties. On the other hand, when the amount of the photo-induced acid generator added exceeds 30 parts by weight, the solubility thereof in the composition (containing a solvent) is saturated. This is likely to cause the precipitation of crystals on the coating or dimerization or trimerization of the photo-induced acid generator which lowers the light absorption efficiency and consequently lowers the sensitivity. Photo-induced acid generators may be used as a mixture of two or more.

Commercially available photo-induced acid generators include those manufactured by Midori Kagaku Co., Ltd., for example, triazines including TAZ-100, TAZ-101, TAZ-102, TAZ-104, TAZ-106, TAZ-107, TAZ-110, TAZ-111, TAZ-113, TAZ-114, TAZ-118, TAZ-119, and TAZ-120 and onium salts, for example, triphenylsulfonium salts including TPS-102, TPS-103, TPS-105, MDS-103, MDS-105, MDS-305, BDS-105, DTS-102, DTS-103, MAT-103, MAT-105, NDS-103, and NDS-105.

Silane coupling agents may be added to improve the adhesion of the color filter layer to the substrate glass. Silane coupling agents usable herein include vinylsilane, acrylsilane, epoxysilane, and aminosilane. More specifically, examples of vinylsilanes usable herein include vinyltrichlorosilane, vinyltris(β-methoxyethoxy)silane, vinyltriethoxysilane, and vinyltrimethoxysilane. Examples of acrylsilanes usable herein include γ-methacryloxypropyltrimethoxysilane and γ-methacryloxypropylmethyldimethoxysilane. Examples of epoxysilanes usable herein include β-(3,4-epoxycyclohexyl)ethyltrimethoxysilane, γ-glycidoxypropyltrimethoxysilane, and γ-glycidoxypropylmethyldiethoxysilane. Examples of aminosilanes usable herein include N-β-(aminoethyl)-γ-aminopropyltrimethoxysilane, N-β-(aminoethyl)-γ-aminopropylmethylditrimethoxysilane, γ-aminopropyltriethoxysilane, and N-phenyl-γ-aminopropyltrimethoxysilane. Examples of other silane coupling agents usable herein include γ-mercaptopropyltrimethoxysilane, γ-chloropropyltrimethoxysilane, γ-chloropropylmethyldimethoxysilane, γ-chloropropylmethyldimethoxysiliane, and γ-chloropropylmethyldiethoxysilane.

In order to improve the suitability for coating, a surfactant may be added, and examples of surfactants usable herein include fluorosurfactants and silicone surfactants.

According to the photosensitive resin composition of the present invention, for example, diethylene glycol dimethyl ether, 3-methoxybutyl acetate, propylene glycol monomethyl ether acetate, and 3-methyl-3-methoxybutanol may be used as a solvent to give a concentration of 5 to 50% by weight on a solid basis.

According to the photosensitive resin composition of the present invention, an alkali-developable photocurable copolymer resin having controlled alkali solubility and curability is used in combination with an epoxy-containing copolymer resin having excellent miscibility with the resin. Therefore, the photosensitive resin composition of the present invention possesses excellent hot pure water resistance, solvent resistance, heat resistance, alkali resistance, sensitivity, and pencil hardness.

Next, the color filter of the present invention will be described. FIG. 1 is a schematic diagram showing the construction of one embodiment of the color filter according to the present invention. In FIG. 1, a color filter 1 according to the present invention comprises: a transparent substrate 2; a colored layer 3 and a black matrix 4 each having a predetermined pattern provided on the transparent substrate 2; a protective layer 5 provided so as to cover the colored layer 3; and a transparent electrode 6 provided on the protective layer 5, for a liquid-crystal drive.

In the color filter 1, nonflexible rigid materials, such as quartz glass, Pyrex glass, and synthetic quartz plates, or flexible materials, such as transparent resin films and resin plates for optical purposes, may be used for constituting the transparent substrate 2. Among them, Glass 7059 manufactured by Corning has a low coefficient of thermal expansion, has excellent dimensional stability and workability in heat treatment at high temperatures, and, because of an alkali-free glass, is particularly suitable for color filters used in color liquid-crystal displays.

The colored layer 3 in the color filter 1 has a red attern 3R, a green pattern 3G, and a blue pattern 3B arranged in a desired form such as mosaic, stripe, triangular, or four-pixel placement. The black matrix 4 is provided between adjacent color patterns and the outside of the colored layer 3 forming region in its predetermined portion.

The colored layer 3 may be formed by any method, for example, a dyeing method which comprises coating a dyeing substrate, exposing the dyeing substrate through a photomask, developing the exposed dyeing substrate to form a pattern, and dyeing the pattern, a pigment dispersion method which comprises previously dispersing a color pigment in a photosensitive resist, exposing the resist through a photomask, and developing the exposed resist, a printing method wherein each color is printed using printing inks, or an electrodeposition method which comprises previously forming a transparent conductive layer on a transparent substrate, forming a positive-working resist layer on the transparent conductive layer, exposing the resist layer through a photomask, developing the exposed resist layer to expose predetermined portions of the transparent conductive layer, immersing the transparent substrate in an electrodeposition liquid, and, in this state, energizing the transparent conductive layer to perform electrodeposition, thereby forming a colored layer.

The black matrix 4 also may be formed by any one of the dyeing method, pigment dispersion method, printing method, and electrodeposition method. Further, chromium vapor deposition or the like may be used for the formation of the black matrix 4.

The protective layer may be formed by coating the photosensitive resin composition of the present invention onto the transparent substrate, with the colored layer and the black matrix formed thereon, by spin coating, roller coating, spray coating, printing or the like to a thickness of 0.5 to 20 $\mu$m, preferably 1 to 8 $\mu$m, on a dry basis, exposing the coating through a predetermined photomask, and then developing the exposed coating. When spin coating is used, the number of revolutions of the spin coater is preferably 500 to 1500 rpm.

The exposure of the coating is carried out by applying ultraviolet light through a photomask. After the exposure, alkali development is carried out, followed by heat treatment (post-baking). Thus, the protective layer is formed. The protective layer 5 has a film strength of not less than 4H in terms of pencil hardness after immersion of the protective layer in an 1% aqueous sodium hydroxide solution (solution temperature=25° C.) for 24 hr. Further, after the immersion in the alkali solution, the protective layer is not separated. That is, the protective layer 5 has very high alkali resistance.

After the exposure and the development with an alkali, unreacted acid groups are present in the photosensitive resin composition. According to the present invention, however, since the epoxy resin contained in the photosensitive resin composition is reacted with the residual acid groups upon heat treatment, any acid group reactive with an alkali is absent in the formed protective layer. Therefore, the protective layer has excellent alkali resistance.

Heat treatment (post-baking) after the completion of the exposure of the coating of the photosensitive resin composition and the alkali development may be generally carried out under conditions of 120 to 250° C. and about 5 to 90 min. This heat treatment permits the epoxy resin contained in the photosensitive resin composition to be reacted with the remaining acid groups.

The transparent electrode may be provided on the protective layer by a conventional film forming method, such as sputtering, vacuum deposition, or CVD, using indium tin oxide (ITO), zinc oxide (ZnO), tin oxide (SnO), or an alloy thereof and optionally performing etching using a photoresist to form a predetermined pattern. The thickness of the transparent electrode is about 20 to 500 nm, preferably about 100 to 300 nm.

The following examples further illustrate the present invention. (Synthesis of epoxy-containing copolymer resin ①)

The following composition was provided.

Methyl methacrylate . . . 571 g

2-Hydroxyethyl methacrylate . . . 163 g

Glycidyl methacrylate . . . 81 g

This composition, together with 5 g of azobisisobutyronitrile, was dissolved in 650 g of 3-methoxybutyl acetate. The solution was then added dropwise to a polymerizer containing 1000 g of 3-methoxybutyl acetate at 100° C. over a period of 6 hr. Thus, polymerization was carried out to prepare a polymer solution.

The polymer solution had a solid content of 33% by weight and a viscosity of 31.8 mPa·s (25° C., Brookfield viscometer). The polymer had a weight average molecular weight of 10,000 as determined using polystyrene as a standard.

The copolymer thus obtained comprised 75.8% by mole of methyl methacrylate units, 16.7% by mole of 2-hydroxyethyl methacrylate units, and 7.5% by mole of glycidyl methacrylate units.

A mixture having the following composition was added dropwise to the polymer solution over a period of 5 hr.

2-Methacryloylethyl isocyanate . . . 270 g

Dibutyltin laurate . . . 1 g

3-Methoxybutyl acetate . . . 2230 g

The progress of the reaction was monitored by IR (an infrared absorption spectrum), and the reaction was continued until the peak attributable to the isocyanate group at 2200 cm$^{-1}$ had disappeared.

The reaction solution thus obtained had a solid content of 22% by weight and a viscosity of 20 mPa·s (25° C., Brookfield viscometer). The polymer had a weight average molecular weight of 11,000 as determined using polystyrene as a standard.

(Synthesis of Epoxy-containing Copolymer Resin ②)

The following composition was provided.

Benzyl methacrylate . . . 204 g

Styrene . . . 286 g

2-Hydroxyethyl methacrylate . . . 163 g

Glycidyl methacrylate . . . 163 g

This composition, together with 5 g of azobisisobutyronitrile, was dissolved in 650 g of 3-methoxybutyl acetate. The solution was then added dropwise to a polymerizer containing 1000 g of 3-methoxybutyl acetate at 100° C. over a period of 6 hr. Thus, polymerization was carried out to prepare a polymer solution.

The polymer solution had a solid content of 33% by weight and a viscosity of 41.3 mPa·s (25° C., Brookfield viscometer). The polymer had a weight average molecular weight of 11,000 as determined using polystyrene as a standard.

The copolymer thus obtained comprised 18.3% by mole of benzyl methacrylate units, 43.6% by mole of styrene units, 19.9% by mole of 2-hydroxyethyl methacrylate units, and 18.2% by mole of glycidyl methacrylate units.

A mixture having the following composition was added dropwise to the polymer solution over a period of 5 hr.

2-Methacryloylethyl isocyanate . . . 270 g

Dibutyltin laurate . . . 1 g

3-Methoxybutyl acetate . . . 2230 g

The progress of the reaction was monitored by IR (an infrared absorption spectrum), and the reaction was continued until the peak attributable to the isocyanate group at 2200 cm$^{-1}$ had disappeared.

The reaction solution thus obtained had a solid content of 21% by weight and a viscosity of 25 mPa·s (25° C., Brookfield viscometer). The polymer had a weight average molecular weight of 12,000 as determined using polystyrene as a standard.

(Synthesis of Epoxy-containing Copolymer Resin ③)

The following composition was provided.

Methyl methacrylate . . . 489 g

2-Hydroxyethyl methacrylate . . . 163 g

Oxetane methacrylate (OXE-30, manufactured by Osaka Organic Chemical Industry Ltd.) . . . 163 g This composition, together with 5 g of azobisisobutyronitrile, was dissolved in 650 g of 3-methoxybutyl acetate. The solution was then added dropwise to a polymerizer containing 1000 g of 3-methoxybutyl acetate at 100° C. over a period of 6 hr. Thus, polymerization was carried out to prepare a polymer solution.

The polymer solution had a solid content of 33% by weight and a viscosity of 40.3 mPa·s (25° C., Brookfield viscometer). The polymer had a weight average molecular weight of 10,000 as determined using polystyrene as a standard.

The copolymer thus obtained comprised 69.5% by mole of methyl methacrylate units, 17.9% by mole of 2-hydroxyethyl methacrylate units, and 12.6% by mole of oxetane methacrylate units.

A mixture having the following composition was added dropwise to the polymer solution over a period of 5 hr.

2-Methacryloylethyl isocyanate . . . 270 g

Dibutyltin laurate . . . 1 g

3-Methoxybutyl acetate . . . 2230 g

The progress of the reaction was monitored by IR (an infrared absorption spectrum), and the reaction was continued until the peak attributable to the isocyanate group at 2200 cm$^{-1}$ had disappeared.

The reaction solution thus obtained had a solid content of 21% by weight and a viscosity of 27 mPa·s (25° C., Brookfield viscometer). The polymer had a weight average molecular weight of 12,000 as determined using polystyrene as a standard.

(Synthesis of Epoxy-containing Copolymer Resin ④)

The following composition was provided.

Methyl methacrylate . . . 530 g b 2-Hydroxyethyl methacrylate . . . 163 g

Methacrylic acid . . . 41 g

Oxetane methacrylate (OXE-30, manufactured by Osaka Organic Chemical Industry Ltd.) . . . 184 g This composition, together with 5 g of azobisisobutyronitrile, was dissolved in 800 g of 3-methoxybutyl acetate. The solution was then added dropwise to a polymerizer containing 1000 g of 3-methoxybutyl acetate at 80° C. over a period of 5 hr. Thus, polymerization was carried out to prepare a polymer solution.

The polymer solution had a solid content of 34% by weight and a viscosity of 34.7 mPa·s (25° C., Brookfield viscometer). The polymer had a weight average molecular weight of 8,600 as determined using polystyrene as a standard.

The copolymer thus obtained comprised 70.9% by mole of methyl methacrylate units, 16.8% by mole of 2-hydroxyethyl methacrylate units, 6.4% by mole of methacrylic acid units, and 5.9% by mole of oxetane methacrylate units.

A mixture having the following composition was added dropwise to the polymer solution over a period of 5 hr.

2-Methacryloylethyl isocyanate . . . 270 g

Dibutyltin laurate . . . 1 g

3-Methoxybutyl acetate . . . 2230 g

The progress of the reaction was monitored by IR (an infrared absorption spectrum), and the reaction was continued until the peak attributable to the isocyanate group at 2200 cm$^{-1}$ had disappeared.

The reaction solution thus obtained had a solid content of 21% by weight and a viscosity of 24 mPa·s (25° C., Brookfield viscometer). The polymer had an acid value of 23.2 mg KOH/g, and a weight average molecular weight of 9,300 as determined using polystyrene as a standard.

(Synthesis of Alkali-developable Photocurable Copolymer Resin (1) shown in Table 1)

The following composition was provided.

Benzyl methacrylate . . . 264 g

Styrene . . . 385 g

Acrylic acid . . . 216 g

2-Hydroxyethyl methacrylate . . . 234 g

This composition, together with 5 g of azobisisobutyronitrile, was dissolved in 650 g of 3-methoxybutyl acetate. The solution was then added dropwise to a polymerizer containing 1,000 g of 3-methoxybutyl acetate at 100° C. over a period of 6 hr. Thus, polymerization was carried out to prepare a polymer solution.

The polymer solution had a solid content of 40% by weight and a viscosity of 1,050 mPa·s (30° C., Brookfield viscometer). The polymer had an acid value of 152 mg KOH/g, a hydroxyl value of 90 mg KOH/g, and a weight average molecular weight of 37,000 as determined using polystyrene as a standard.

The copolymer thus obtained comprised 15% by mole of styrene units, 37% by mole of benzyl methacrylate units, 30% by mole of acrylic acid units, and 18% by mole of 2-hydroxyethyl methacrylate units.

A mixture having the following composition was added dropwise to the polymer solution over a period of 5 hr.

2-Methacryloylethyl isocyanate . . . 270 g

Dibutyltin laurate . . . 1 g

3-Methoxybutyl acetate . . . 2230 g

The progress of the reaction was monitored by IR (an infrared absorption spectrum), and the reaction was continued until the peak attributable to the isocyanate group at 2200 $cm^{-1}$ had disappeared.

The reaction solution thus obtained had a solid content of 26% by weight and a viscosity of 500 mPa·s (30° C., Brookfield viscometer). The polymer had an acid value of 120 mg KOH/g, a hydroxyl value of 5 mg KOH/g, and a weight average molecular weight of 45,000 as determined using polystyrene as a standard and contained 17% by mole of (meth)acryloyl groups.

EXAMPLE 1

A red photosensitive resin having the following composition was spin coated on a 1.1 mm-thick glass substrate (AL material, manufactured by Asahi Glass Co., Ltd.) to a coating thickness of 1.5 μm. The coated substrate was dried for 30 min in an oven of 70° C. Next, the coated surface was exposed to light from a mercury lamp through a photomask having a predetermined pattern, followed by spray development with water for one min to form a red relief pattern in regions where red pixels are to be formed. Thereafter, curing treatment was carried out at 150° C. for 30 min.

Next, the same procedure as used in the formation of the red relief pattern was repeated, except that a green photosensitive resin having the following composition was used. Thus, a green relief pattern was formed in regions where green pixels are to be formed.

The same procedure as used in the formation of the red relief pattern was then repeated, except that a blue photosensitive resin having the following composition was used. Thus, a blue relief pattern was formed in regions where blue pixels are to be formed. Thus, colored layers of three colors, red (R), green (G), and blue (B) were prepared.

(Composition of Red Photosensitive Resin)

Pyrazolone Red (red pigment) . . . 10 pts.wt.

Polyvinyl alcohol/5% stilbazolium quinolium (photosensitive resin) . . . 5 pts.wt.

Water . . . 85 pts.wt.

(Composition of Green Photosensitive Resin)

Lionol Green 2Y-301 (green pigment) . . . 9 pts.wt.

Polyvinyl alcohol/5% stilbazolium quinolium (photosensitive resin) . . . 5 pts.wt.

Water . . . 86 pts.wt.

(Composition of Blue Photosensitive Resin)

Fastogen Blue (blue pigment) . . . 3 pts.wt.

Polyvinyl alcohol/5% stilbazolium quinolium (photosensitive resin) . . . 5 pts.wt.

Water . . . 92 pts.wt.

A photosensitive resin composition prepared by the following method was spin coated onto the glass substrate, with the colored layers formed thereon, to a coating thickness of 1.2 μm on a dry basis. (Preparation of photosensitive resin composition A)

The following compounds were provided.

Alkali-developable photocurable copolymer resin (1) synthesized above (solid content 26 wt %) . . . 8.1 pts.wt.

Dipentaerythritol pentaacrylate (SR 399, manufactured by Sartomer) . . . 6.3 pts.wt.

Epoxy-containing copolymer resin ① synthesized above (on a solid basis) . . . 10.8 pts.wt.

2-Methyl-1-[(4-methylthio)phenyl]-2-morpholinopropanone-1 . . . 1.2 pts.wt.

2,2'-Bis(o-chlorophenyl)-4,5,4',5'-tetraphenyl-1,2'-bilmidazole . . . 0.9 pt.wt.

Triazine (TAZ 110, manufactured by Midori Kagaku Co., Ltd. . . . 0.3 pt.wt.

Diethylene glycol dimethyl ether . . . 34.6 pts.wt.

3-Methoxybutyl acetate . . . 37.0 pts.wt.

They were mixed together at room temperature with stirring to prepare a photosensitive resin composition A of the present invention.

(Step of Exposure and Development)

The coatings of the photosensitive resin compositions were fully air dried, and then prebaked on a hot plate at 80° C. for 5 min. Thereafter, a photomask was disposed at a position 100 μm distant from the coating of the photosensitive resin composition. Ultraviolet light was applied by a proximity aligner from a 2.0 kW ultrahigh-pressure mercury lamp at an exposure of 100 mJ/$cm^2$ only to regions corresponding to colored layer-forming regions. The exposed assembly was then immersed in a 0.05% aqueous potassium hydroxide solution (liquid temperature 23° C.) for one min to perform alkali development. Thus, only uncured portions in the coating of the photosensitive resin composition were removed.

Thereafter, the assembly was allowed to stand in a clean oven in an atmosphere of 180° C. for 30 min to perform final curing, thereby forming a transparent protective layer. The thickness of the transparent protective layer after the final curing was about 1.5 μm.

EXAMPLE 2

A photosensitive resin composition B was prepared in the same manner as in Example 1, except that the epoxy-containing copolymer resin ② was used instead of the epoxy-containing copolymer resin ① prepared above. A color filter was then prepared in the same manner as in Example 1, except that the photosensitive resin composition B prepared just above was used.

EXAMPLE 3

A photosensitive resin composition C was prepared in the same manner as in Example 1, except that the epoxy-containing copolymer resin ③ was used instead of the epoxy-containing copolymer resin ① prepared above. A color filter was then prepared in the same manner as in Example 1, except that the photosensitive resin composition C prepared just above was used.

Comparative Example 1

A color filter was prepared in the same manner as in Example 1, except that the following photosensitive resin composition D was used instead of the photosensitive resin composition in Example 1.

The following compounds were provided.

Alkali-developable photocurable copolymer resin (1) synthesized above (solid content 26 wt %) . . . 10.0 pts.wt.

Dipentaerythritol pentaacrylate (SR 399, manufactured by Sartomer) . . . 15.2 pts.wt.

2-Methyl-1-[(4-methylthio)phenyl]-2-morpholinopropanone-1 . . . 1.2 pts.wt.

2,2'-Bis(o-chlorophenyl)-4,5,4',5'-tetraphenyl-1,2'-biimidazole . . . 0.9 pt.wt.

Triazine (TAZ 110, manufactured by Midori Kagaku Co., Ltd. . . . 0.3 pt.wt.

Diethylene glycol dimethyl ether . . . 34.6 pts.wt.

3-Methoxybutyl acetate . . . 37.0 pts.wt.

They were mixed together at room temperature with stirring.

Comparative Example 2

A color filter was prepared in the same manner as in Example 1, except that the following photosensitive resin composition E was used instead of the photosensitive resin composition in Example 1.

The following compounds were provided.

Alkali-developable photocurable copolymer resin (1) synthesized above (solid content 26 wt %) . . . 8.1 pts.wt.

Dipentaerythritol pentaacrylate (SR 399, manufactured by Sartomer) . . . 6.3 pts.wt.

Bisphenol A type epoxy resin (as a solid content) . . . 10.8 pts.wt.

2-Methyl-1-[(4-methylthio)phenyl]-2-morpholinopropanone-1 . . . 1.2 pts.wt.

2,2'-Bis(o-chlorophenyl)-4,5,4',5'-tetraphenyl-1,2'-biimidazole . . . 0.9 pt.wt.

Diethylene glycol dimethyl ether . . . 34.6 pts.wt.

3-Methoxybutyl acetate . . . 37.0 pts.wt.

They were mixed together at room temperature with stirring.

The photosensitive resin compositions A to E were coated directly on a 1.1 mm-thick glass substrate (AL material, manufactured by Asahi Glass Co., Ltd.) in the same manner as described above, and the coatings were treated in the same manner as described above to form protective layers. The protective layers on the color filters and the protective layers on the glass plate were evaluated for hot pure water resistance, solvent resistance, heat resistance, alkali resistance, sensitivity, and pencil hardness under the following conditions.

(Hot Pure Water Resistance)

The samples were immersed in pure water of 80° C. for one hr, and a cross-cut tape peel test was then carried out.

(Solvent Resistance)

The samples were immersed in N-methylpyrrolidone of 40° C. for one hr, and a cross-cut tape peel test was then carried out.

(Heat Resistance)

The samples were allowed to stand in a clean oven of 250° C. for one hr, and a cross-cut tape peel test was then carried out.

(Alkali Resistance)

The samples were immersed in a 1% aqueous sodium hydroxide solution of 23° C. for 24 hr, and a cross-cut tape peel test was then carried out.

(Sensitivity)

The sensitivity was evaluated in terms of exposure which can resolve a 30-$\mu$m line-and-space pattern which can withstand development.

(Pencil Hardness)

The pencil hardness was measured according to the testing method 8.4.1 in a pencil scratch test specified in JIS K 5400-1990.

The cross-cut tape peel test in the evaluation for the hot pure water resistance, the solvent resistance, the heat resistance, and the alkali resistance was carried out by the following method according to JIS K 5400-1990 8.5.

On a substantially middle portion of a test piece were provided 11 parallel cut flaw lines at clearance intervals of 1 mm in each of vertical and lateral directions of the test piece in such a manner that the cut flaw lines in the vertical direction were orthogonal to the cut flaw lines in the lateral direction to form 100 cross cuts in one cm. In the provision of the cut flaw lines, a cutter guide or the like was used, and, while the knife edge of a cutter knife was kept at a definite angle in the range of 35 to 45 degrees to the surface of the coating, the cutter knife was drawn so as to reach through the coating to the substrate of the test piece at an equal speed of 0.5 sec per cut flow line. A pressure-sensitive adhesive tape was applied to the test piece with cut flaws provided therein, and then separated from the test piece. The state of cross-cut flaws was observed. The results were evaluated according to the following criteria.

Evaluation Criteria

10: Each cut flaw was fine, both sides of each cut flaw were smooth, and the intersecting point of cut flaws and each square cut were free from peeling.

8: Slight peeling was observed at the intersecting point of cut flaws, each square cut was free from peeling, and the defect part was within 5% of the total square area.

6: Peeling was observed at both sides and intersecting point of cut flaws, and the defect part was 5 to 15% of the total square area.

4: The width of peeling caused by cut flaw was large, and the defect part was 15 to 35% of the total square area.

2: The width of peeling caused by cut flaw was broader than 4 points, and the defect part was 35 to 65% of the total square area.

0: The peel area was not less than 65% of the total square area.

TABLE 3

| | Resin | Hot pure water resistance | Solvent resistance | Heat resistance | Alkali resistance | Pencil hardness | Sensitivity, mJ/cm$^2$ |
|---|---|---|---|---|---|---|---|
| Protective layer on glass substrate | A | 10 | 10 | 10 | 8 | 3H | 75 |
| | B | 10 | 10 | 10 | 8 | 3H | 75 |
| | C | 10 | 10 | 10 | 8 | 3H | 75 |
| | D | 0 | 4 | 6 | 0 | H | 75 |
| | E | 6 | 6 | 6 | 6 | 2H | 150 |
| Protective layer on color filter | A | 8 | 8 | 8 | — | — | — |
| | B | 8 | 8 | 8 | — | — | — |
| | C | 8 | 8 | 8 | — | — | — |
| | D | 0 | 4 | 6 | — | — | — |
| | E | 4 | 6 | 6 | — | — | — |

What is claimed is:

1. A color filter comprising: a transparent substrate; a colored layer provided on the transparent substrate; and a protective layer provided so as to cover the colored layer, said protective layer having been formed by coating a photosensitive resin composition comprising:

an alkali-developable photocurable copolymer resin; an epoxy-containing copolymer resin; a bifunctional or higher polyfunctional photopolymerizable acrylate monomer; and an initiator added in an amount sufficient for photocuring to proceed that is a radical polymerization initiator or a photo-induced acid generator, said alkali-developable photocurable copolymer resin comprising 5 to 55% by mole of constituent units represented by formula (1) and 5 to 95% by mole of constituent units represented by formula (2), the constituent units represented by formula (1) having been partially reacted, through carboxyl groups thereof, with a (meth)acryloylalkyl isocyanate compound, the constituent units represented by formula (2) having been partially reacted, through hydroxyl groups thereof, with (meth)acryloylalkyl isocyanate compound, said copolymer resin containing 5 to 95% by mole of (meth)acryloyl groups and having an acid value of 5 to 400 mg KOH/g and a weight average molecular weight of 5,000 to 1,000,000 as determined using polystyrene as a standard, said epoxy-containing copolymer resin comprising 0 to 55% by mole of constituent units represented by formula (1), 5 to 95% by mole of constituent units represented for formula (2), and 5 to 95% by mole of constituent units represented by formula (3), the constituent units represented by formula (1) having been partially reacted, through carboxyl groups thereof, with a (meth)acryloylalkyl isocyanate compound, the constituent units represented by formula (2) having been partially reacted, through hydroxyl groups thereof, with a (meth)acryloylalkyl isocyanate compound, said copolymer resin containing 5 to 95% by mole of (meth)acryloyl groups and having an acid value of 0 to 400 mg KOH/g and a weight average molecular weight of 5,000 to 1,000,000 as determined using polystyrene as a standard:

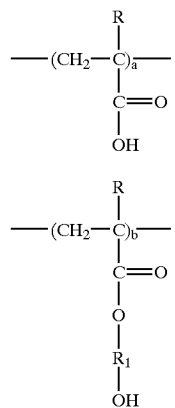

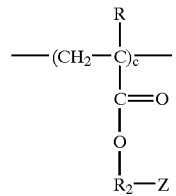

wherein R represents hydrogen or an alkyl group having 1 to 5 carbon atoms; $R_1$ represents an alkylene group having 2 to 4 carbon atoms; $R_2$ represents an alkylene group having 1 to 4 carbon atoms; Z represents a 1,2-epoxy, 1,3-epoxy, or 1,4-epoxy group; and a, b, and c are integers corresponding respectively to contents in terms of % by mole of the constituent units, exposing the coating, developing the exposed coating with an alkali, and heating the developed coating.

2. The color filter according to claim 1, wherein the alkali-developable photocurable copolymer resin and the epoxy-containing copolymer resin further comprise 0 to 75% by mole of constituent units represented by formula (4) and 0 to 75% by mole of constituent units represented by formula (5):

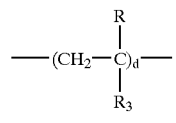

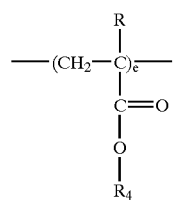

wherein R represents hydrogen or an alkyl group having 1 to 5 carbon atoms, $R_3$ represents an aromatic carbon ring, $R_4$ represents an alkyl or aralkyl group, and d and e are integers corresponding respectively to contents in terms % by mole of the constituent units.

* * * * *